United States Patent
Jeong et al.

(10) Patent No.: US 8,610,192 B2
(45) Date of Patent: *Dec. 17, 2013

(54) NON-VOLATILE MEMORY DEVICES HAVING CHARGE STORAGE LAYERS AT INTERSECTING LOCATIONS OF WORD LINES AND ACTIVE REGIONS

(75) Inventors: Won-Cheol Jeong, Seoul (KR); Su-Jin Ahn, Seoul (KR); Yoon-Moon Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/173,759

(22) Filed: Jun. 30, 2011

(65) Prior Publication Data

US 2011/0254079 A1  Oct. 20, 2011

Related U.S. Application Data

(63) Continuation of application No. 11/613,345, filed on Dec. 20, 2006, now Pat. No. 7,989,869.

(30) Foreign Application Priority Data

Mar. 30, 2006 (KR) .................. 10-2006-0029056

(51) Int. Cl.
*H01L 29/76* (2006.01)
*H01L 29/788* (2006.01)

(52) U.S. Cl.
USPC .......................... 257/314; 257/315

(58) Field of Classification Search
USPC ................................. 257/314–323
See application file for complete search history.

(56) References Cited

U.S. PATENT DOCUMENTS

| 6,673,674 B2 | 1/2004 | Inoue et al. |
| 2003/0205751 A1 | 11/2003 | Kimura et al. |
| 2004/0061145 A1 | 4/2004 | Lee et al. |
| 2004/0165443 A1 | 8/2004 | Harari |
| 2005/0063215 A1 | 3/2005 | Yang |

(Continued)

FOREIGN PATENT DOCUMENTS

| JP | 02-110981 | 4/1990 |
| KR | 10-0190021 B1 | 1/1999 |

(Continued)

OTHER PUBLICATIONS

R. Jacob Baker, Excerpt from Chapter 16 Memory Circuits, CMOS Circuit Design, Layout and Simulation, (Copyright-2005), p. 443-444.

*Primary Examiner* — Ori Nadav
(74) *Attorney, Agent, or Firm* — Myers Bigel Sibley & Sajovec, P.A.

(57) ABSTRACT

A non-volatile memory device can include a plurality of parallel active regions that are defined by a plurality of device isolation layers formed on a semiconductor substrate, where each of the plurality of parallel active regions extends in a first direction and has a top surface and sidewalls. A plurality of parallel word lines can extend in a second direction and cross over the plurality of parallel active regions at intersecting locations. A plurality of charge storage layers can be disposed at the intersecting locations between the plurality of parallel active regions and the plurality of parallel word lines. Each of the plurality of charge storage layers at the intersecting locations can have a first side and a second side that is parallel to the second direction and can have a first length, a third side and a fourth side that are parallel to the first direction and can have a second length, where the first length is less than the second length.

26 Claims, 18 Drawing Sheets

(56) References Cited

U.S. PATENT DOCUMENTS

2005/0223182 A1 10/2005 Zhang
2006/0018181 A1 1/2006 Matsunaga et al.

FOREIGN PATENT DOCUMENTS

| KR | 1999-006718 | 1/1999 |
| KR | 100190021 B1 | 1/1999 |
| KR | 10-2003-0092861 A | 12/2003 |
| KR | 10-20040084225 A | 10/2004 | ic # NON-VOLATILE MEMORY DEVICES HAVING CHARGE STORAGE LAYERS AT INTERSECTING LOCATIONS OF WORD LINES AND ACTIVE REGIONS

CROSS-REFERENCE TO RELATED APPLICATIONS

This application is a Continuation of U.S. application Ser. No. 11/613,345, filed Dec. 20, 2006 now U.S. Pat. No. 7,989,869, in the United States Patent and Trademark Office, and claims priority under 35 U.S.C. §119 of Korean Patent Application No. 10-2006-0029056, filed on Mar. 30, 2006, the entire contents of which are hereby incorporated by reference.

BACKGROUND OF THE INVENTION

The present invention relates to the field of semiconductors in general, and more particularly, to memory devices.

In general, a semiconductor memory devices may be classified as volatile memory devices that can lose stored information when power is turned OFF, and nonvolatile memory device that can retain stored information even when not powered.

A flash memory device is a type of nonvolatile memory device, and can have advantages of an erasable programmable read only memory (EPROM), and an electrically erasable programmable read only memory (EEPROM).

Flash memory devices may be divided into floating gate types and charge trap types according to the type of data storage layer constituting a unit cell. The flash memory devices may also be divided into stacked gate types and split gate types according to the structure of the unit cell.

Furthermore, flash memory devices may be divided into a NOR type and a NAND type. The NOR type flash memory device may have a high operation speed since it can independently control individual memory cells, but undesirably can require one contact per two cells and can have a large cell area. The NAND type flash memory device may be able to control a plurality of memory cells as a string, which can provide advantages in highly integrated applications.

Referring to FIG. 1, which is an equivalent circuit diagram illustrating a part of a general NAND type flash memory device, the NAND type flash memory device may include a cell array including a plurality of cell strings. Each cell string may include a ground selection transistor and a string selection transistor connected in series between a source region and a drain region, and a plurality of memory cells connected in series between the ground selection transistor and the string selection transistor. The cell array includes a plurality of ground selection lines (GSL), a plurality of string selection lines (SSL), and a plurality of word lines (WL) disposed between the string selection line (SSL) and the ground selection line (GSL). Bit lines (BL) are disposed to intersect the word lines (WL). Each bit line is connected to a drain area through a bit line contact (DC). A common source line (CSL) is disposed between the ground selection lines (GSL). Source regions are electrically connected to each other by the common source line (CSL).

Referring to FIG. 2, which is a plan view illustrating a part of the general NAND type flash memory device, active regions 12 are defined by device isolation layers 15 formed on a semiconductor substrate. The active region 12 extends in a first direction (DA). The ground selection line (GSL), the string selection line (SSL), and the word line (WL) cross over the active region 12 defined by the device isolation layer 15. The word line (WL) and the selection line (GSL, SSL) extend in a second direction (DW) intersecting the first direction (DA) at a right angle. The common source line (CSL) is disposed between the ground selection gate lines (GSL) of adjacent cell strings. The common source line (CSL) crosses over the active region and is electrically connected to the active region thereunder. The active region between the adjacent string selection lines (SSL) is electrically connected to a bit line (not shown) crossing over the word line (WL) by a bit line contact (DC). Floating gates 24, which may be charge storage elements, are disposed in regions where the active regions 12 and the word lines (WL) intersect each other. The floating gate 24 is placed between the active region 12 and the word line (WL). When the active region 12, the word line (WL), a region between the active regions 12, and a region between the word lines (WL) have the same width 'a', any floating gate placed at the center is adjacent to two floating gates spaced therefrom at a distance 'a' in the first direction (DA), and also adjacent to two floating gates spaced therefrom at a distance 'a' in the second direction (DW).

As the memory device becomes highly integrated, parasitic capacitance between the floating gates may increase and may cause malfunctioning of the memory device, such as, for example, a program disturbance between the memory cells.

Referring to FIG. 3, which is a schematic perspective view of a flash memory that illustrates a relation between floating gate voltage and parasitic capacitance, gate structures 37 are placed on active regions 19 that are defined by device isolation layers 22 formed in the substrate 10. The gate structure 37 can have a sequentially-stacked structure of a tunnel oxidation layer 25, a floating gate 29, an ONO layer 32, and a control gate 35. The active region 19 extends in the first direction (DA), and the control gate 35 extends in the second direction (DW) to form a word line. Interlayer insulation layers (not shown) are placed between the gate structures 37 adjacent in the first direction (DA).

Reference signs V and C denote a voltage and capacitance at a corresponding position, respectively. Vfg denotes a voltage of a floating gate of the center of nine floating gates. VA denotes a voltage of each of floating gates adjacent to the center floating gate in the first direction (DA), and VW denotes a voltage of each of floating gates adjacent to the center floating gate in the second direction (DW). Also, Cfga denotes parasitic capacitance generated between the floating gates adjacent in the first direction (DA), and Cfgw represents parasitic capacitance generated between the floating gates adjacent in the second direction (DW).

A word line formed of a conductive layer is interposed between the two floating gates adjacent in the second direction (DW) to prevent the parasitic capacitance (Cfgw). However, since just the interlayer insulating layer is placed between the two floating gates adjacent in the first direction (DA), the parasitic capacitance (Cfgw) may not be effectively prevented. That is, electrical interference caused by the floating gates adjacent in the first direction (DA) can be greater than that of the floating gates adjacent in the second direction. Thus, reliability and operation characteristics of the memory device may be lowered.

SUMMARY OF THE INVENTION

Embodiments according to the inventive concept can provide non-volatile memory devices. Pursuant to these embodiments, a non-volatile memory device can include a plurality of parallel active regions that are defined by a plurality of device isolation layers formed on a semiconductor substrate, where each of the plurality of parallel active regions extends in a first direction and has a top surface and sidewalls. A plurality of parallel word lines can extend in a second direction and cross over the plurality of parallel active regions at intersecting locations. A plurality of charge storage layers can be disposed at the intersecting locations between the plurality of parallel active regions and the plurality of parallel word lines. Each of the plurality of charge storage layers at the intersecting locations can have a first side and a second side that is parallel to the second direction and can have a first length, a third side and a fourth side that are parallel to the first direction and can have a second length, where the first length is less than the second length.

In some embodiments according to the inventive concept, the intersecting locations are above the plurality of active regions and below the plurality of word lines. In some embodiments according to the inventive concept, each of the plurality of charge storage layers overlap all portions of the plurality of parallel active regions at the intersecting locations.

In some embodiments according to the inventive concept, the plurality of parallel active regions are exposed through the plurality of charge storage layers thereon between the intersecting locations. In some embodiments according to the inventive concept, the plurality of charge storage layers can be nitride layers. In some embodiments according to the inventive concept, the device can further include a plurality of oxide layers that in contact with the plurality of charge storage layers at the intersecting locations.

In some embodiments according to the inventive concept, a non-volatile memory device can include a plurality of parallel active regions that are defined by a plurality of device isolation layers formed on a semiconductor substrate, where each of the plurality of parallel active regions extends in a first direction and has a top surface and sidewalls. A plurality of parallel word lines can extend in a second direction and cross over the plurality of parallel active regions at intersecting locations. A plurality of charge storage layers can be disposed at the intersecting locations between the plurality of parallel active regions and the plurality of parallel word lines. The intersecting locations can have first and second sides that are parallel to the second direction and have a first length, and third and fourth sides of the intersecting locations can be parallel to the first direction and have a second length that is greater than the first length.

In some embodiments according to the inventive concept, a non-volatile memory device can include a plurality of parallel active regions defined by a plurality of device isolation layers formed on a semiconductor substrate, each of the plurality of parallel active regions can extend in a first direction and have a top surface and sidewalls. A plurality of parallel word lines can extend in a second direction and cross over the plurality of parallel active. A plurality of charge storage layers can be between the plurality of parallel active regions and the plurality of parallel word lines. A plurality of oxide layers can contact the plurality of charge storage layers at contact areas that includes first and second sides that are parallel to the second direction and have a first length, and third and fourth sides of the contact areas can be parallel to the first direction and have a second length that is greater than the first length.

In some embodiments according to the inventive concept, a non-volatile memory device can include an active region in a substrate and a word line that crosses over the active region at an intersecting location. A charge storage layer can be disposed at the intersecting location between the active region and the word line, where the charge storage layer at the intersecting location has first and second opposing sides having a first length. Third and fourth opposing sides of the charge storage layer at the intersecting location can have a second length, wherein the first length is less than the second length.

In some embodiments according to the inventive concept, a non-volatile memory device can include a plurality of parallel active regions that are defined by a plurality of device isolation layers that can be formed on a semiconductor substrate where each of the plurality of parallel active regions extends in a first direction. A plurality of parallel word lines can extend in a second direction and cross over the plurality of parallel active regions at intersecting locations. A plurality of charge storage layers can be disposed between the plurality of parallel active regions and the plurality of parallel word lines at the intersecting locations, where the plurality of charge storage layers substantially overlap all of upper surfaces of the active regions at the intersecting locations and each of the plurality of charge storage layers has a first side and a second side being parallel to the second direction and having a first length, and a third side and a fourth side being parallel to the first direction and having a second length and where the first length is smaller than the second length.

In some embodiments according to the inventive concept, a non-volatile memory device can include an active region in a substrate and a word line that crosses over the active region to define an intersecting location having a rectangular shaped projection onto the substrate. A charge storage layer can be disposed at the intersecting location between the active region and the word line.

BRIEF DESCRIPTION OF THE FIGURES

The components in the drawings are not necessarily to scale, emphasis instead being placed upon clearly illustrating the principles of the present invention. Moreover, in the drawings, like reference numerals designate corresponding parts throughout the several views.

FIGS. 6A through 11A are plan views illustrating methods for forming nonvolatile memory devices according to some embodiments of the present invention.

FIGS. 6B through 11B are cross-sectional views taken along line I-I' of FIGS. 6A through 11B.

FIGS. 6C through 11C are cross-sectional views taken along line II-IF of FIGS. 6A through 11A.

DETAILED DESCRIPTION OF PREFERRED EMBODIMENTS

Figure 1:
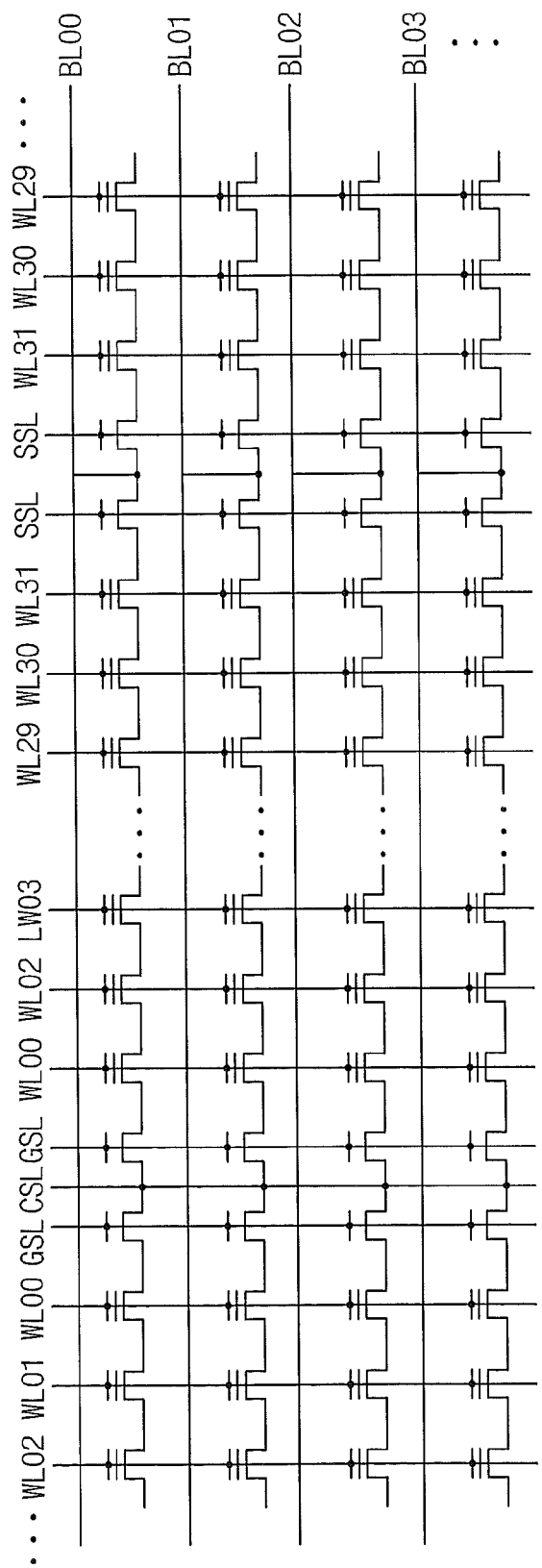
FIG. 1 is an equivalent circuit diagram of a part of a general NAND type flash memory device.
Figure 2:
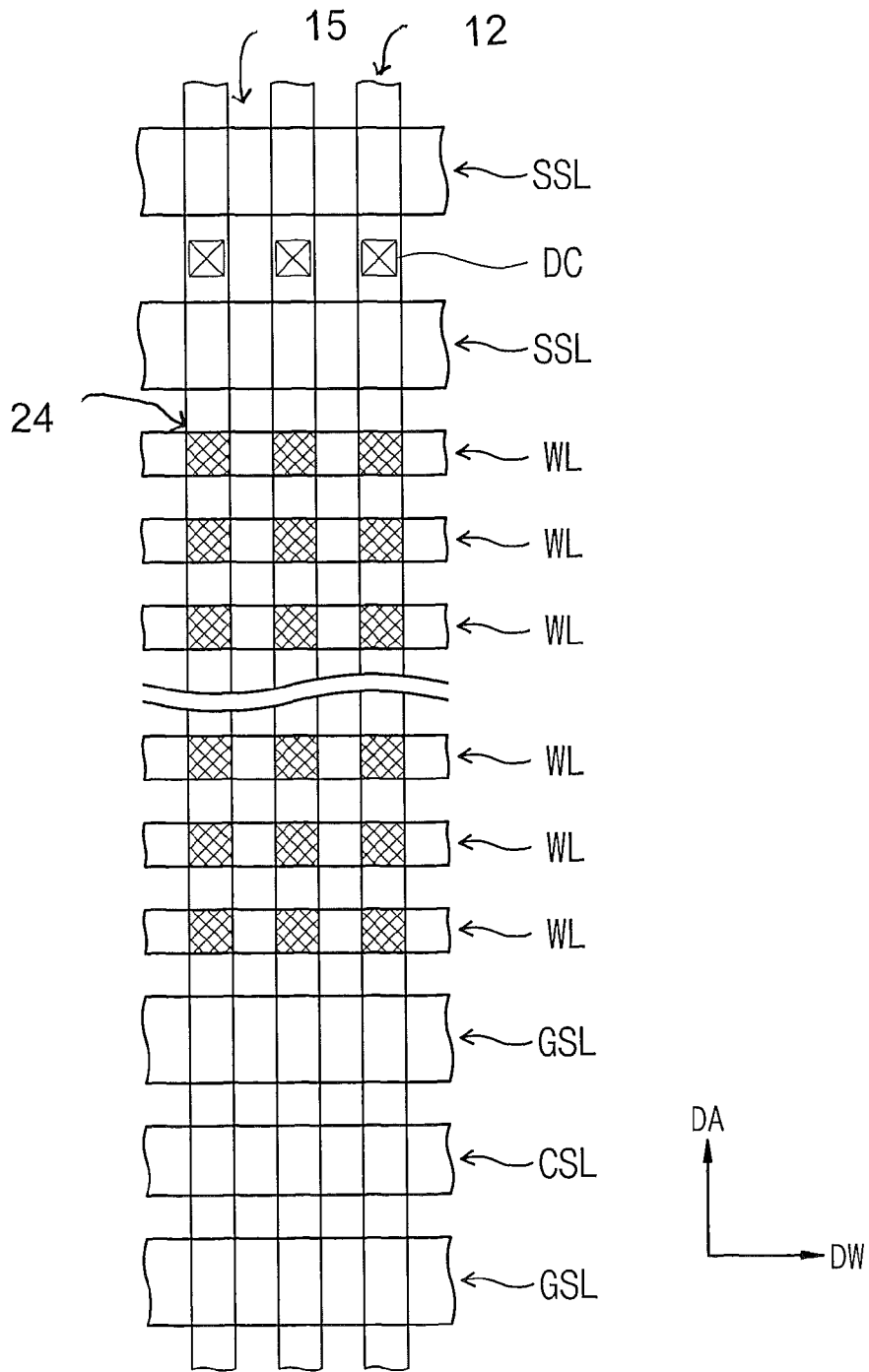
FIG. 2 is a plan view of a part of the general NAND type flash memory.
Figure 3:
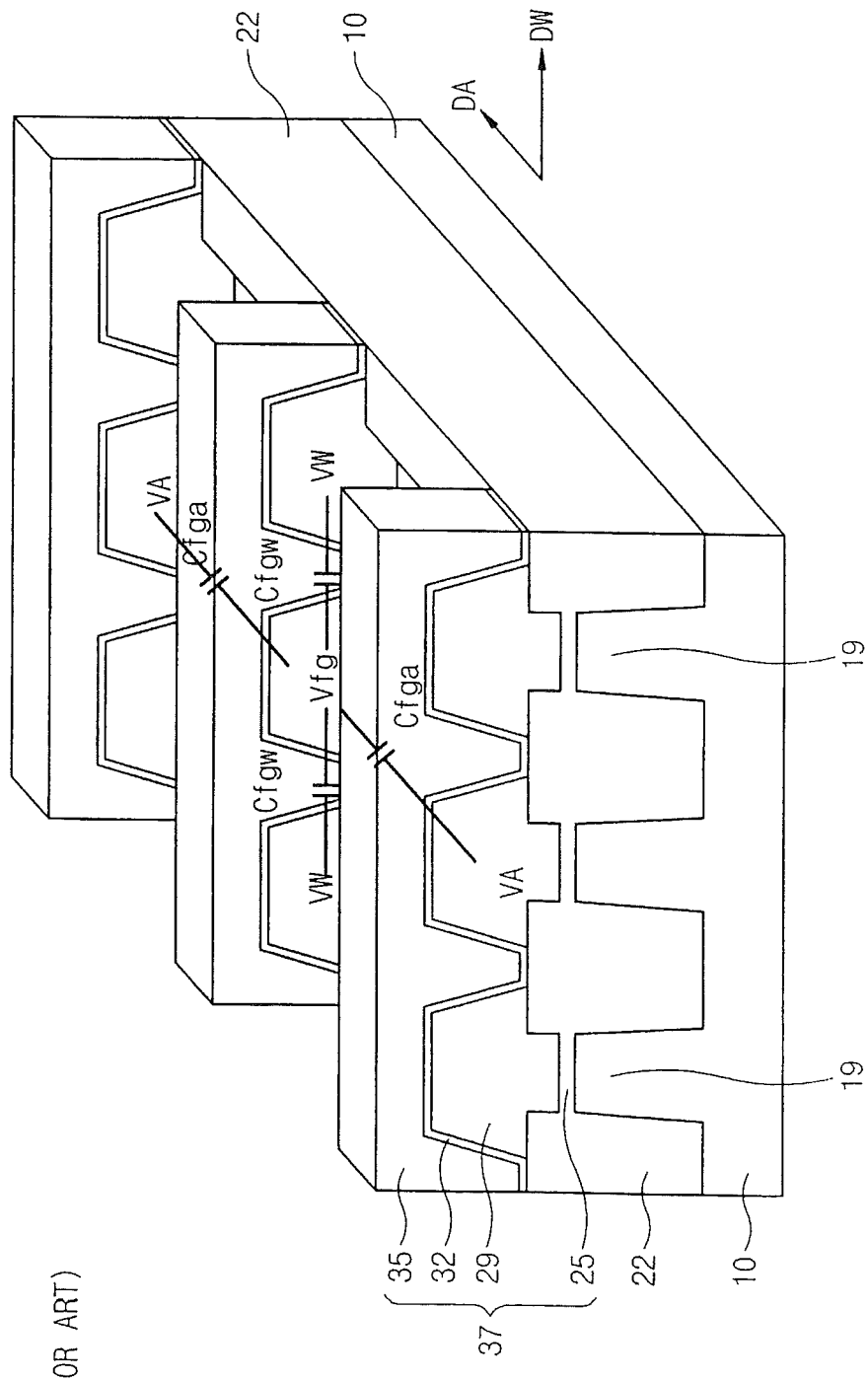
FIG. 3 is a schematic perspective view of a part of a flash memory device for describing a relation between a floating gate voltage and parasitic capacitance.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items. Also, the term pitch refers to a distance from the center of, for example, one pattern to the center of an adjacent pattern in the case where the patterns are repetitively formed on a substrate.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although a floating gate flash memory device is described by way of example, the present invention is not limited thereto, and may be applied to various memory devices such as, for example, a charge trapping flash memory device.

Figure 4A:
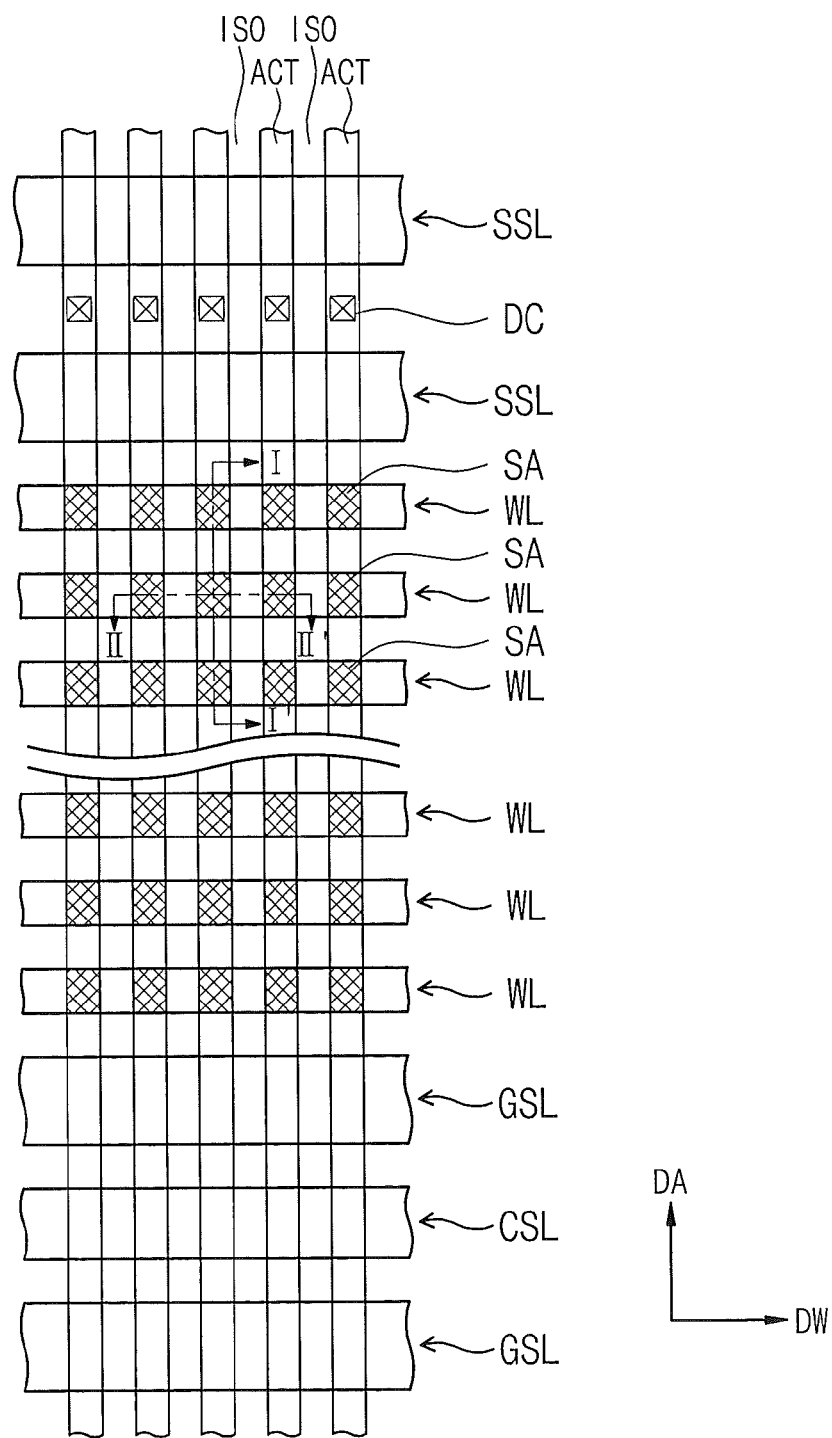
FIG. 4A is a schematic plan view of nonvolatile memory device according to some embodiments of the present invention.

Referring to FIG. 4A, which is a schematic plan view of a nonvolatile memory device according to some embodiments of the present invention, active regions (ACT) extending in a first direction (DA) may be defined by device isolation layer patterns (ISO) formed on a semiconductor substrate. String selection lines (SSL) and ground selection lines (GSL) cross over the active regions (ACT) and extend in a second direction intersecting the first direction. Multiple word lines (WL) extending in the second direction (DW) are disposed between the string selection line (SSL) and the ground selection line (GSL). The active regions (ACT) at one side of the string selection line (SSL) are electrically connected to bit lines (not shown) by bit line contacts (DC). The active regions (ACT) at one side of the ground selection line (GSL) may be electrically connected to each other by a common source line (CSL) extending in the second direction. The first direction (DA) and the second direction (DW) may be perpendicular to one another. Charge storage regions (SA) are defined in regions where the active regions (ACT) and the word lines (WL) intersect each other. In some embodiments, the charge storage regions (SA) may be self-aligned to the active regions (ACT) and the word lines (WL).

Figure 5:
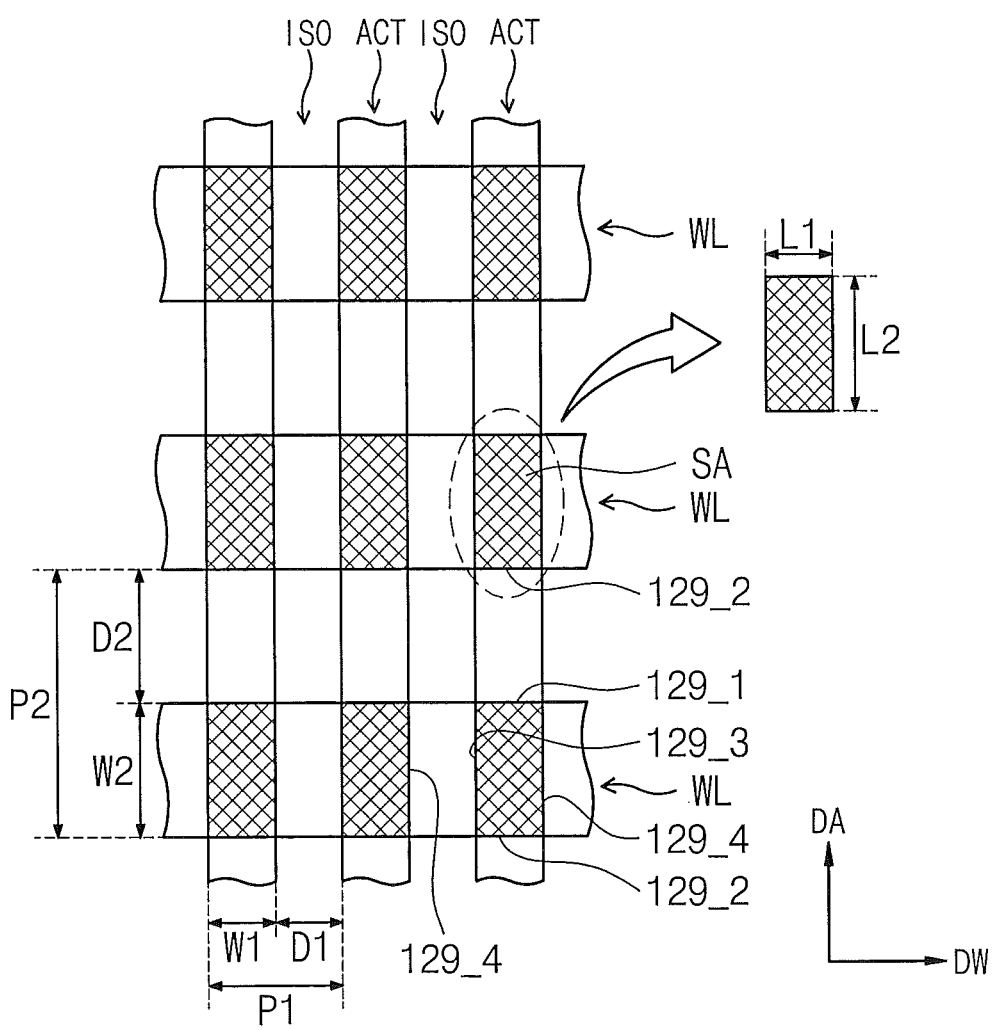
FIG. 5 is an enlarged view of a part of a memory cell region of FIG. 4A.

Referring to FIG. 5, which is an enlarged view of a part of a memory cell region of FIG. 4A, the active regions (ACT) extend in the first direction (DA), and the word lines (WL) extend in the second direction (DW). The first direction (DA) and the second direction (DW) may be perpendicular to one another. The charge storage regions (SA) are defined by respective intersections between the active regions (ACT) and the word lines (WL). In some embodiments, the charge storage regions (SA) are aligned in a matrix configuration (in the first and second directions).

The active regions have a first pitch (P1) and the word lines (WL) have a second pitch (P2), such that the first pitch (P1) may be smaller than the second pitch (P2). Also, the active region (ACT) has a first width (W1) and the word line (WL) has a second width (W2), such that the first width (W1) may be smaller than the second width (W2). A distance (D1) between the active regions is substantially equal to a value obtained by subtracting the first width (W1) from the first pitch (P1) and is smaller than a distance (D2) between the word lines. In this regard, the distance (D2) is substantially equal to a value obtained by subtracting the second width (W2) from the second pitch (P2). In this manner, a distance between the charge storage regions (SA) adjacent in the first direction is longer than a distance between the charge storage regions (SA) adjacent in the second direction. Accordingly, electrical interference generated between the charge storage regions (SA) adjacent in the first direction may be reduced.

The charge storage region (SA) may have a rectangular shape. For example, the charge storage region (SA) may have a first side 129_1 and a second side 129_2 parallel to the second direction (DW), and a third side 1293 and a fourth side 129_4 parallel to the first direction (DA). Accordingly, the first side 129_1 and the second side 129_2 of the adjacent two charge storage regions (SA) face each other, and the third 129_3 and the fourth side 129_4 thereof face each other. The first side 129_1 and the second side 129_2 may have the same length, and may have a first length (L1). The third side 129_3 and the fourth side 129_4 may have the same length, and may have a second length (L2). A length of each of the two facing sides of the charge storage regions (SA) adjacent in the first direction (i.e., a length of an overlapping portion of the corresponding two sides) is smaller than a length of each of the two facing sides of the charge storage regions (SA) adjacent in the second direction (i.e., a length of an overlapping portion of the corresponding two sides). Accordingly, electrical interference between the charge storage regions (SA) adjacent in the first direction may be reduced.

Figure 4B:
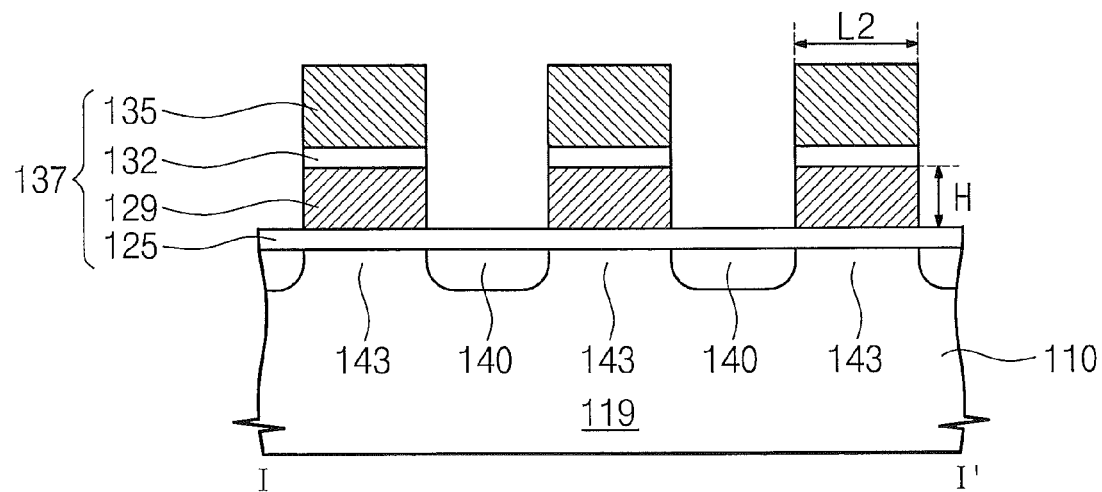
FIG. 4B is a cross-sectional view taken along line I-I' of FIG. 4A.
Figure 4C:
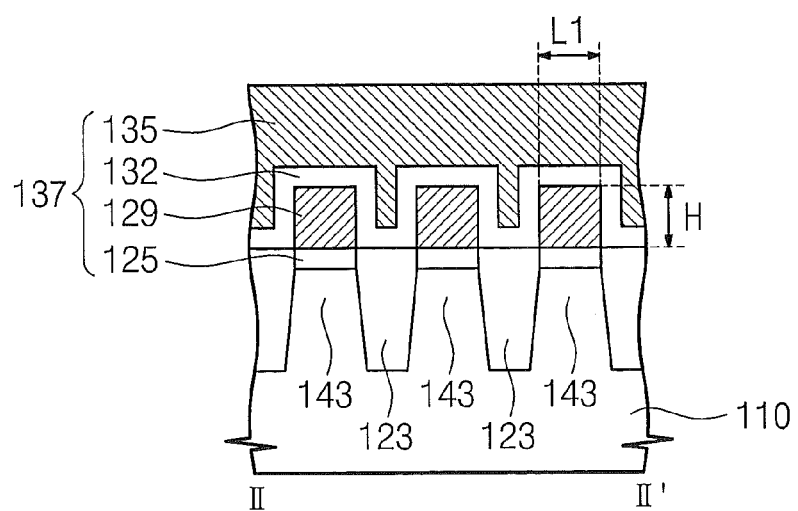
FIG. 4C is a cross-sectional view taken along line II-II' of FIG. 4A.

Referring to FIGS. 4B and 4C, which are cross-sectional views taken along lines I-I' and respectively, of FIG. 4A, the active regions 119 may be defined by the device isolation layer patterns 123 formed in the semiconductor substrate 110. Gate structures 137 are placed on the active regions 119. The gate structure 137 may have a sequentially-stacked structure of a gate insulating layer 125, a floating gate pattern 129, an intergate insulating layer 132, and a control gate pattern 135.

The floating gate pattern 129 corresponds to the charge storage region (see FIG. 5), and may function as a charge storage layer. The control gate pattern 135 extends in the second direction and may form a word line. Impurity regions 140 for source and drain regions are placed in the active region 119 at both sides of the floating gate pattern 129, and channel regions 143 are placed between the impurity regions 140 in the active region.

Referring again to FIGS. 4B and 4C, two sides of the floating gate pattern 129 facing the first direction (in a direction of the active region) each have a first area (L1×H), and another two sides of the floating gate pattern 129 facing the second direction (in a direction of the word line) each have a second area (L2×H). Since the width (L1) of the floating gate pattern in the second direction is smaller than a width (L2) of the floating gate pattern in the first direction, the first area (L1×H) is smaller than the second area (L2×H). Accordingly, electrical interference generated between two floating gate patterns 129 adjacent in the first direction (DA) may be reduced.

FIGS. 6A through 11A are plan views illustrating methods for forming nonvolatile memory devices according to some embodiments of the present invention. FIGS. 6B through 11B are cross-sectional views taken along lines I-I' of FIGS. 6A through 11A, respectively, and FIGS. 6C through 11C are cross-sectional views taken along lines II-II' of FIGS. 6A through 11A, respectively.

Figure 6A:
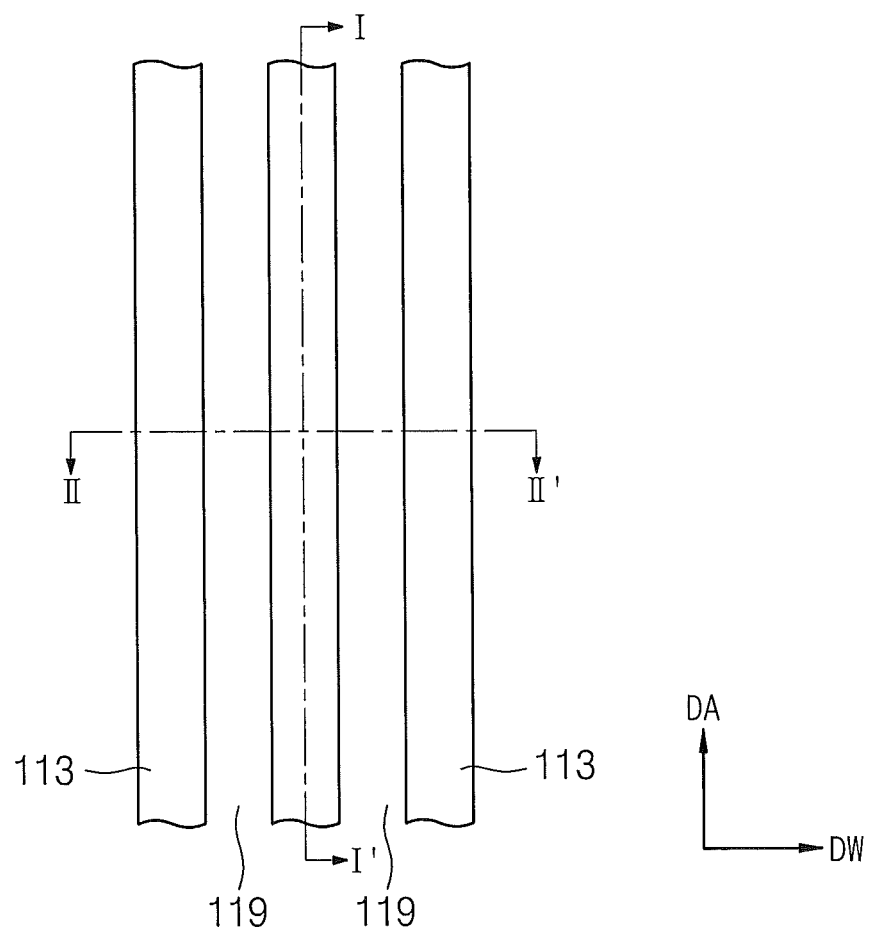
Figure 6B:
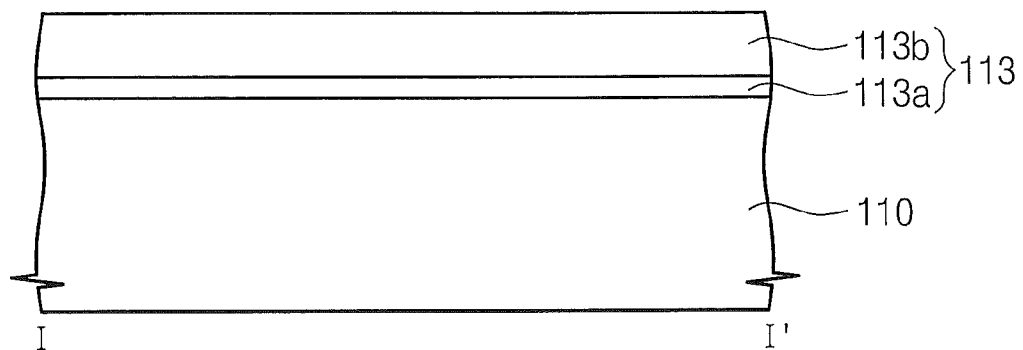
Figure 6C:
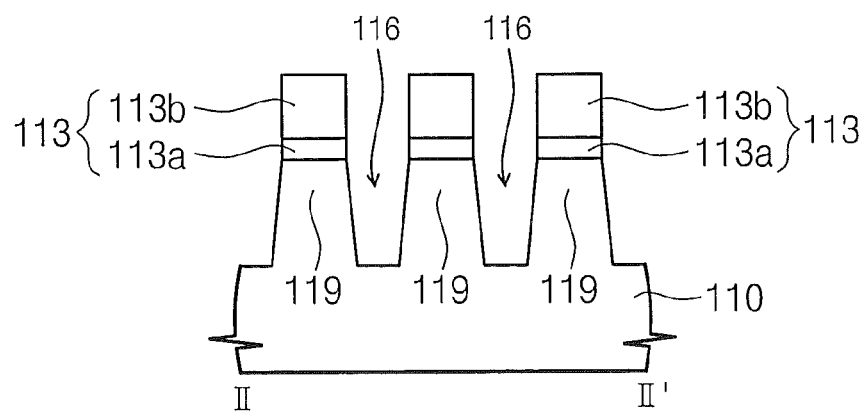

Referring to FIGS. 6A through 6C, a mask pattern 113 extends in a first direction (DA) on a semiconductor substrate 110. Various semiconductor substrates 110 may be used as the semiconductor substrate 110, such as a single crystal bulk silicon substrate, a silicon on insulator (SOI) substrate, a silicon on sapphire (SOS) substrate, or the like. The mask pattern 113 may have a stacked structure including an oxide layer 113a and a nitride layer 113b at a position corresponding to the active region 119. The oxidation layer 113a may serve as a pad oxidation layer that can reduce stress that may be generated between the semiconductor substrate 110 and the nitride layer 113b.

A trench 16 for device isolation may be formed in the semiconductor substrate through an etching process using the mask pattern 113 as an etching mask. Then, as optional processes, a thermal oxidation process may be further performed for recovering from etching damage. A liner layer forming process may be performed to prevent infiltration of impurities into the active region.

Using an etching process, an active region 119 extending in the first direction (DA) is formed at the semiconductor substrate 110 under the mask pattern 113 (i.e., between trenches).

Figure 7A:
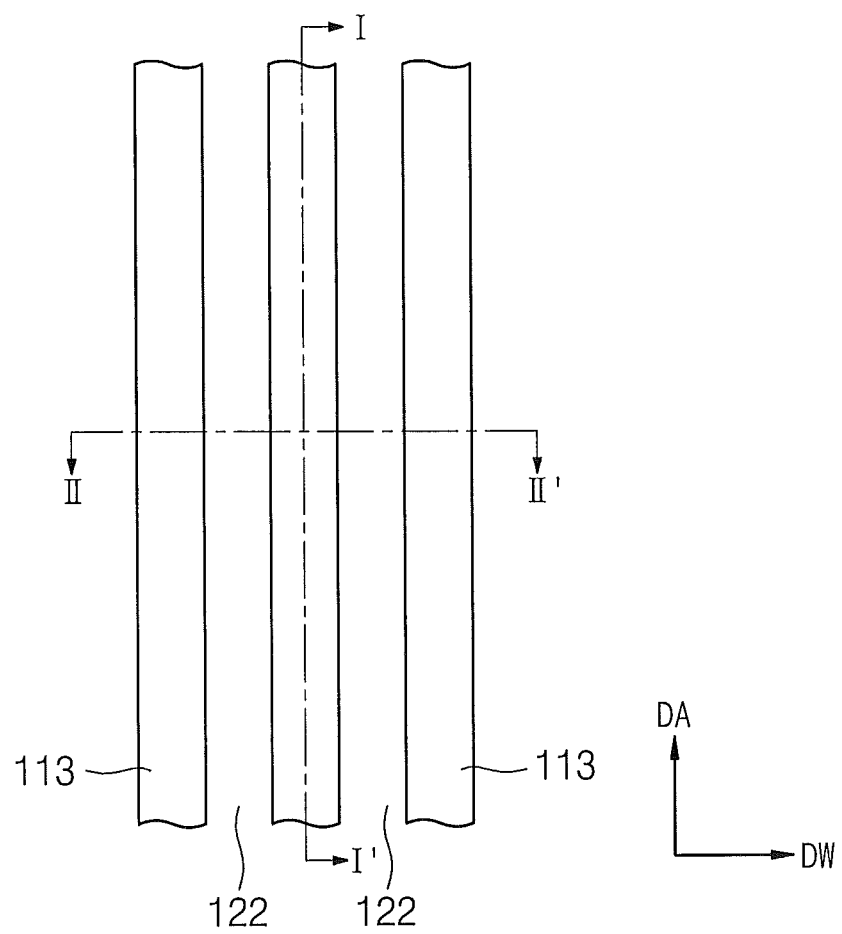
Figure 7B:
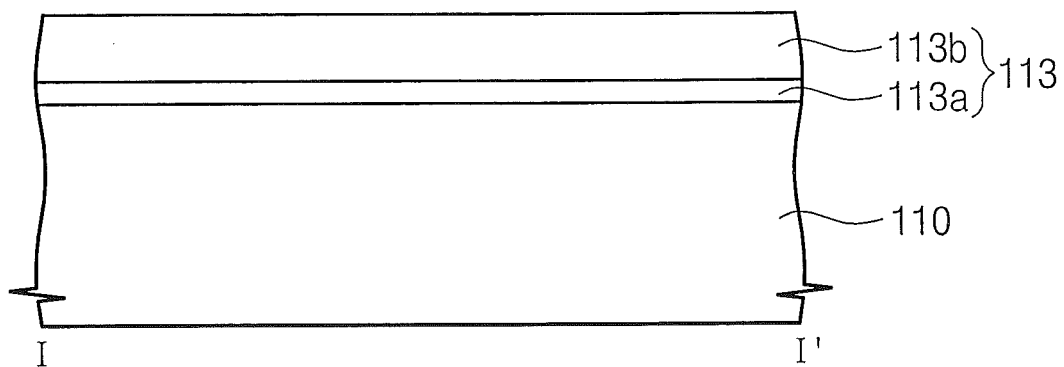
Figure 7C:
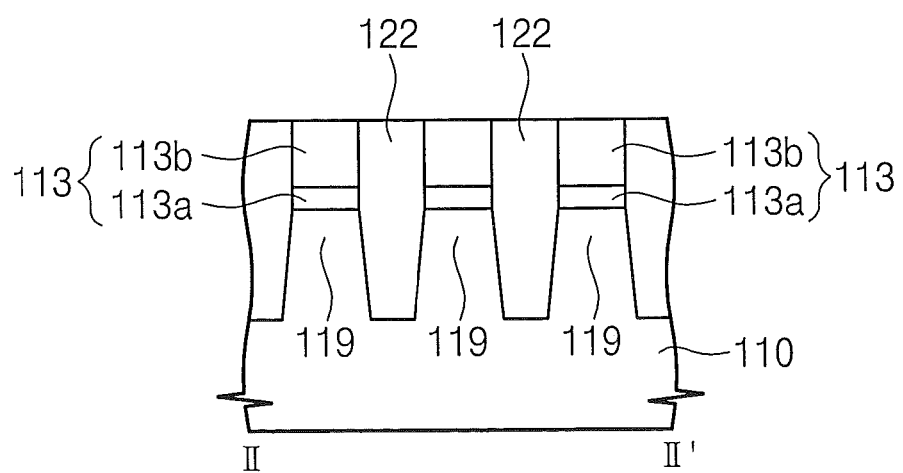

Referring to FIGS. 7A through 7C, a thin film forming process may be performed to fill the trench 116 with an insulating layer. A planarization process is performed to expose an upper surface of the mask pattern 113 and thus form a device isolation layer 122.

A chemical vapor deposition (CVD) process may be performed as the thin film forming process. Specifically, a high-density plasma chemical vapor deposition process implementing a high deposition speed may be performed in some embodiments. Accordingly, the device isolation layer formed by the thin film forming process may be a CVD oxidation layer. A chemical mechanical polishing (CMP) process, or an etch-back process may be used as the planarization process.

Figure 8A:
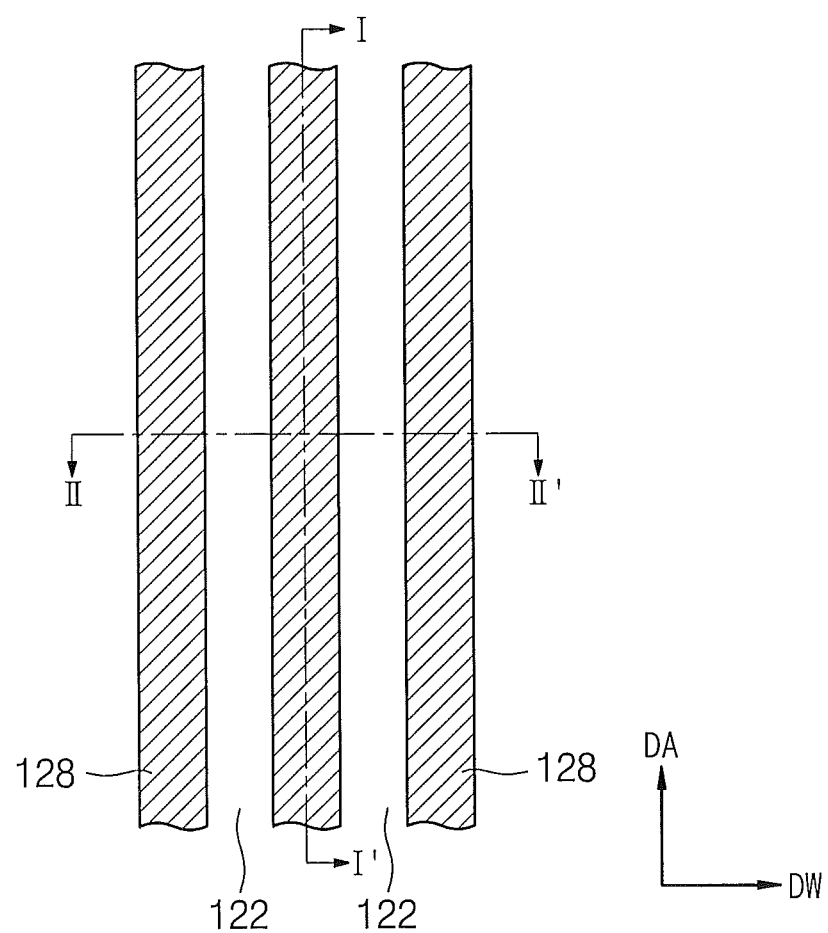
Figure 8B:
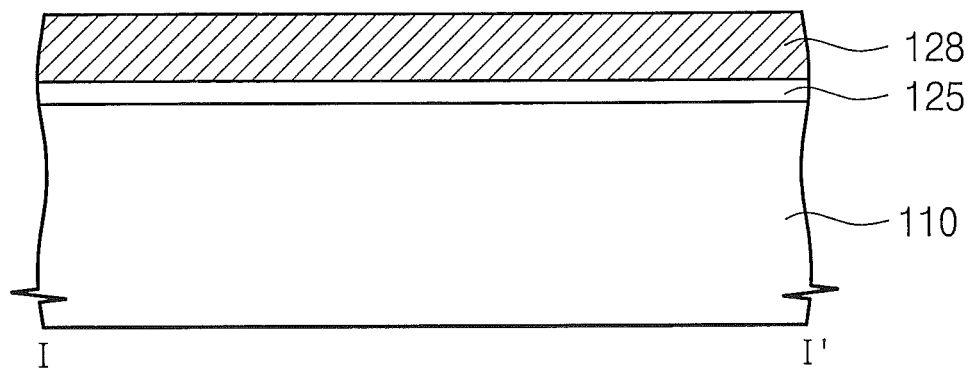
Figure 8C:
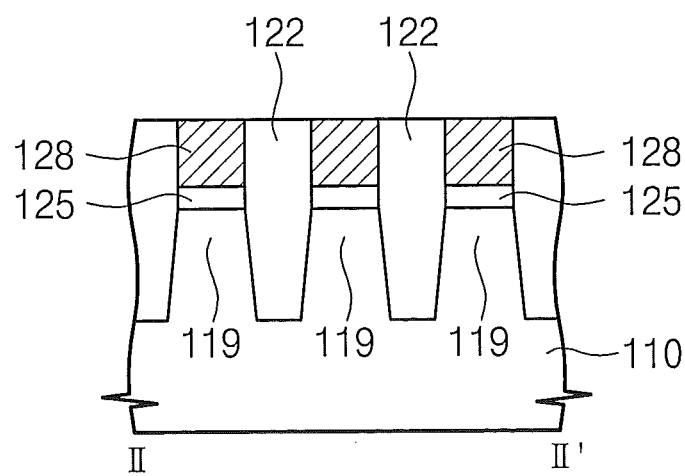

Referring to FIGS. 8A through 8C, the mask pattern 113 is removed. Thereafter, a thin film forming process may be performed to form a gate insulating layer 125 on the active region 119. The gate insulating layer 125 may be a thermal oxidation layer formed by, for example, a thermal oxidation process.

Next, a thin film forming process may be performed to form a conductive layer on the gate insulating layer 125. Thereafter, a planarization process is performed to expose an upper surface of the device isolation layer 122 and thus form a floating gate conductive layer 128. Thus, the floating gate conductive layer 128 may be self-aligned to the active region 119.

The floating gate conductive layer 128 may be formed of polysilicon by a CVD process. In some embodiments, impurity ions may be injected in-situ during the thin film forming process, or may be injected through a separate ion implantation process after the thin film formation.

A CMP process or an etching process may be performed as the planarization process. A slurry or an etching gas may have an etch selectivity with respect to the conductive layer. The term "etch selectivity" refers to the property of a specific etching gas or an etching solution that is able to perform selective etching with respect to one of two layers.

Figure 9A:
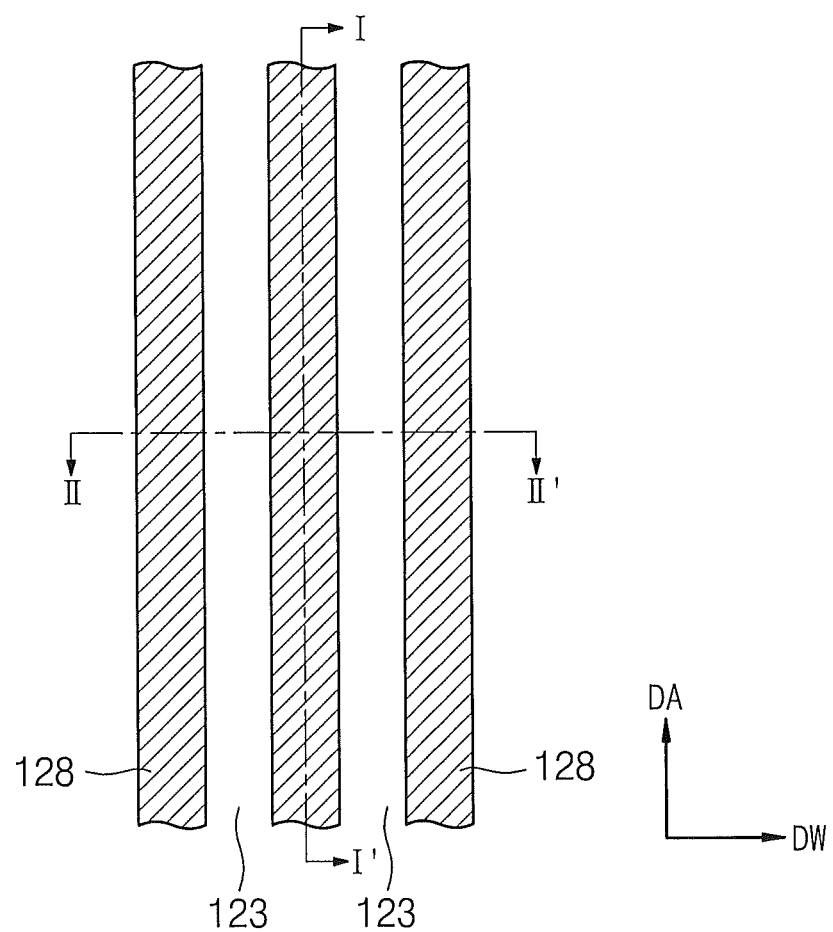
Figure 9B:
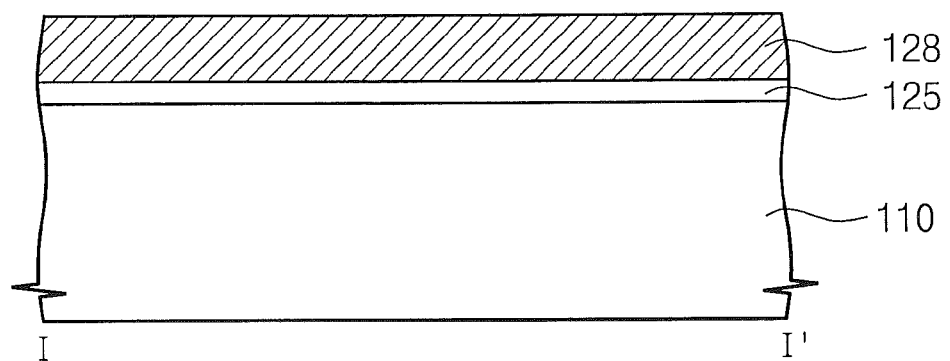
Figure 9C:
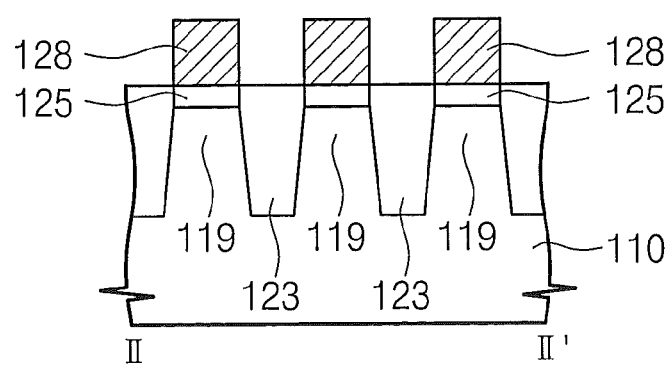

Referring to FIGS. 9A through 9C, an etching process may be performed to recess an upper surface of a device isolation layer and thus form a device isolation pattern 123. In the etching process, an etching gas or an etching solution having an etch selectivity with respect to the device isolation layer may be used. In this manner, an upper surface of the device isolation layer pattern 123 is lower than an upper surface of the floating gas conductive layer 128.

Figure 10A:
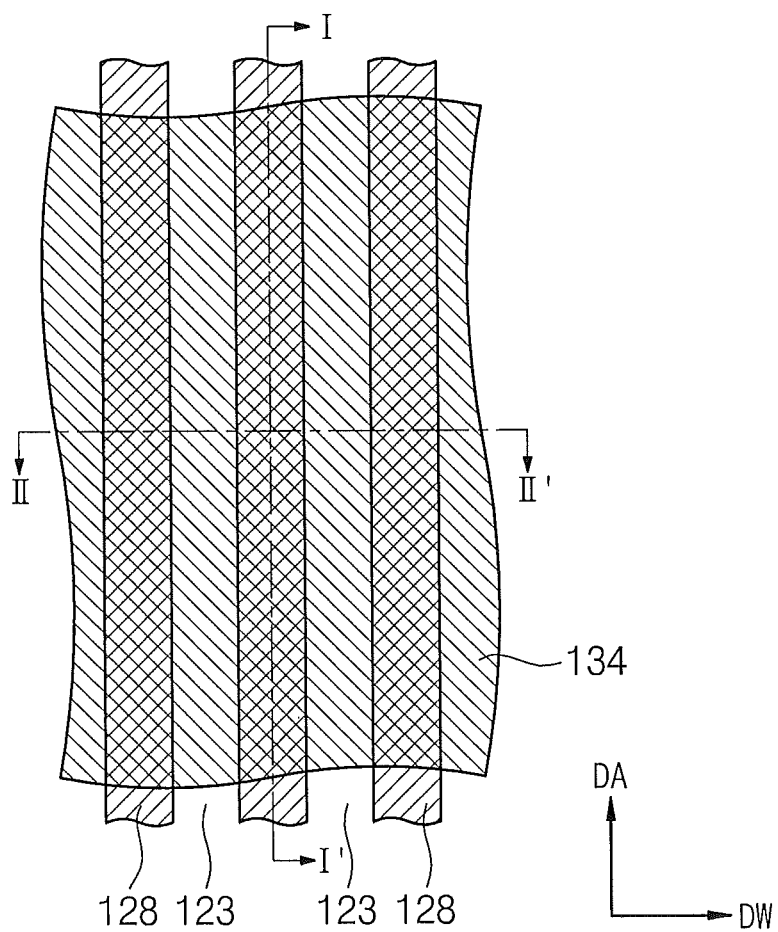
Figure 10B:
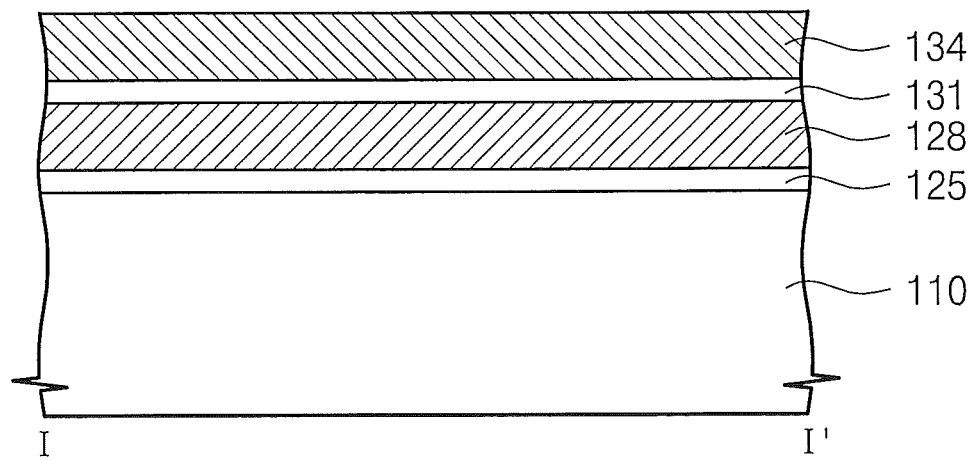
Figure 10C:
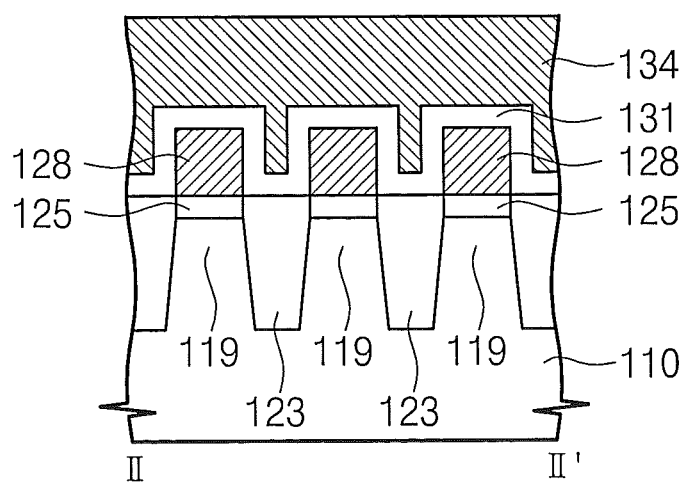

Referring to FIGS. 10A through 10C, a thin film forming process may be performed to form an insulating layer 131 and a control gate conductive layer 134. The insulating layer 131 may have a multi-layered structure of an oxide layer/a nitride layer/an oxide layer through a CVD process. The control gate conductive layer 134 may have a multi-layered structure of, for example, polysilicon or polysilicon and silicide through a CVD process.

Figure 11A:
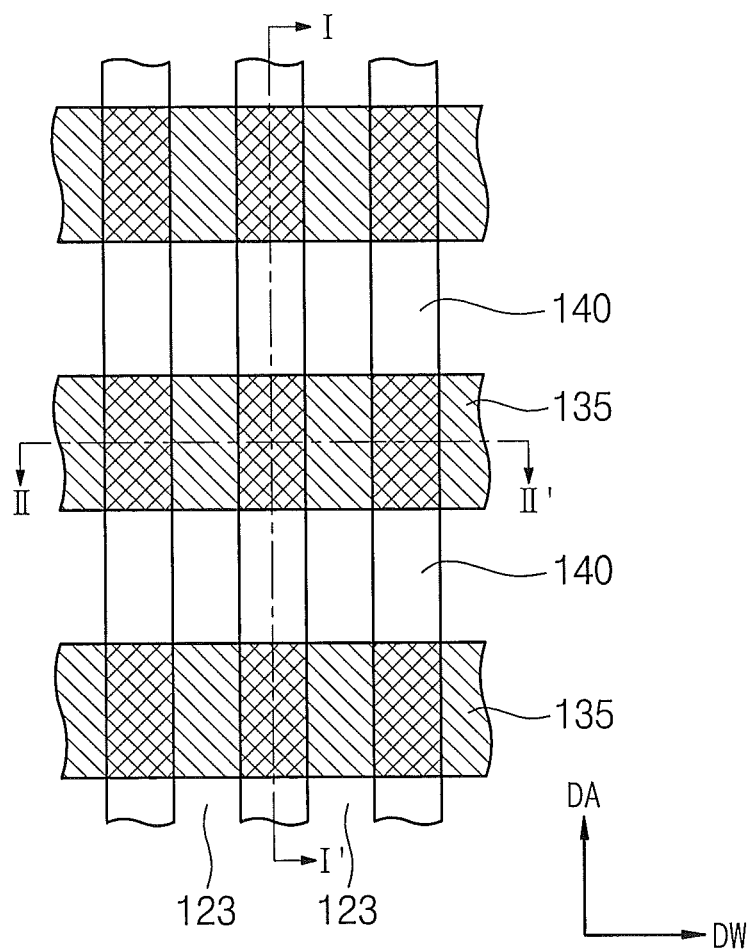
Figure 11B:
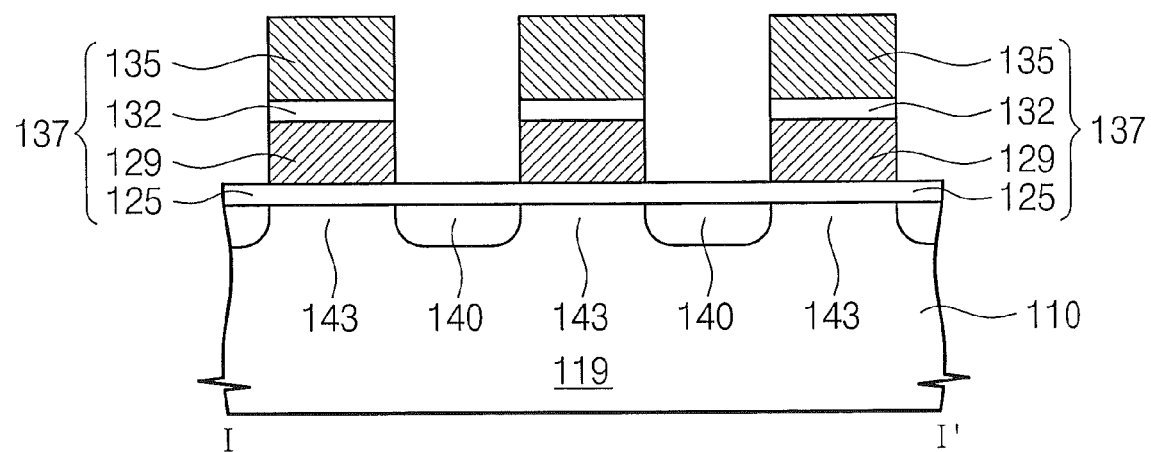
Figure 11C:
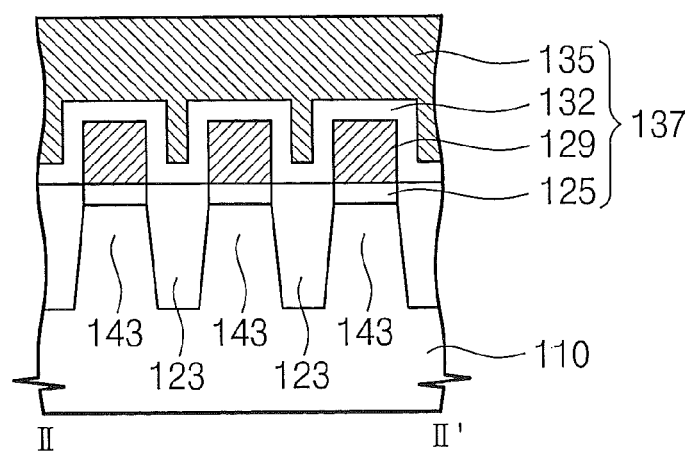

Referring to FIGS. 11A through 11C, an etching process for patterning the control gate conductive layer 134, the insulating layer 131 and the floating gate conductive layer 128 may be performed to form control gate patterns 135, intergate insulating layers 132, and floating gate patterns 129. In this manner, gate structures 137 are formed, each of which may include the gate insulating layer 125, the floating gate pattern 129, the intergate insulating layer 132, and the control gate pattern 135. The control gate pattern 135 extends in the second direction (DW) intersecting the first direction (DA) to form a word line. Such floating gate patterns 29 may be self-aligned to the active regions and the word lines, and may be arranged in the first and second directions (DA and DW).

In the etching process, a pitch of the word lines may become greater than a pitch of the active regions. Also, the width of the word line may be greater than the width of the active region and a distance between the word lines may be greater than a distance between the active regions.

Thereafter, an ion implantation process may be performed to form impurity regions 140 to be source and drain regions in the active regions 119 at both sides of the word line. Also, a channel region 143 may be formed in the active region between the impurity regions 140 (i.e., the active region under the floating gate pattern).

According to some embodiments, since a pitch of word lines may be greater than that of active regions, electrical interference that may occur between two charge storage regions adjacent in an active-region direction may decrease.

According to some embodiments, since a distance between the word lines may be greater than that between the active regions, the electrical interference that may occur between two charge storage regions adjacent in the active-region direction may decrease.

According to some embodiments, each of sides of the charge storage regions (e.g., floating gate patterns) facing each other in the active region direction may have a smaller area than an area of each of sides of the charge storage regions facing each other in a word-line direction. In this manner, the electrical interference that may occur between the two charge storage regions adjacent in a direction of the active region may decrease.

When the disclosure herein is applied to embodiments of a charge trapping type flash memory device, a nitride layer may be used as a charge storage layer. Further, in some embodiments, the insulating layer may not be patterned in a direction in which an active region extends and/or a word line extends.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A nonvolatile memory device comprising:
a plurality of parallel active regions defined by a plurality of device isolation layers formed on a semiconductor substrate, each of the plurality of parallel active regions extending in a first direction and having a top surface and sidewalls;
a plurality of parallel word lines each extending in a second direction and overlapping each of the plurality of parallel active regions at respective locations; and
a plurality of charge storage layers each disposed at each of the respective locations between the plurality of parallel active regions and the plurality of parallel word lines,
wherein each of the plurality of charge storage layers at the respective locations has a first side and a second side each parallel to the second direction and each having a first length, and a third side and a fourth side each parallel to the first direction and each having a second length, wherein the first length is less than the second length.

2. The device of claim 1 wherein the respective locations are above the plurality of active regions and below the plurality of word lines.

3. The device of claim 1 wherein each of the plurality of charge storage layers overlap all portions of the plurality of parallel active regions at the respective locations.

4. The device of claim 3 wherein the plurality of parallel active regions are exposed through the plurality of charge storage layers thereon between the respective locations.

5. The device of claim 1 wherein the plurality of charge storage layers comprise nitride layers.

6. The device of claim 1 further comprising:
a plurality of oxide layers in contact with the plurality of charge storage layers at the respective locations.

7. A nonvolatile memory device comprising:
a plurality of parallel active regions defined by a plurality of device isolation layers formed on a semiconductor substrate, each of the plurality of parallel active regions extending in a first direction and having a top surface and sidewalls;
a plurality of parallel word lines each extending in a second direction and overlapping each of the plurality of parallel active regions at respective locations; and
a plurality of charge storage layers each disposed at each of the respective locations between the plurality of parallel active regions and the plurality of parallel word lines;
wherein the respective locations comprise first and second sides each parallel to the second direction and each having a first length, and third and fourth sides each parallel to the first direction and each having a second length that is greater than the first length.

8. The device of claim 7 wherein the respective locations are above the plurality of active regions and below the plurality of word lines.

9. The device of claim 7 wherein each of the plurality of charge storage layers overlap all portions of the plurality of parallel active regions at the respective locations.

10. The device of claim 9 wherein the plurality of parallel active regions are exposed through the plurality of charge storage layers thereon between the respective locations.

11. The device of claim 7 wherein the charge storage layers comprise nitride layers.

12. The device of claim 7 further comprising:
a plurality of oxide layers in contact with the plurality of charge storage layers at the respective locations.

13. A nonvolatile memory device comprising:
a plurality of parallel active regions defined by a plurality of device isolation layers formed on a semiconductor substrate, each of the plurality of parallel active regions extending in a first direction and having a top surface and sidewalls;
a plurality of parallel word lines each extending in a second direction and overlapping each of the plurality of parallel active regions;
a plurality of charge storage layers between the plurality of parallel active regions and the plurality of parallel word lines; and
a plurality of oxide layers each contacting the plurality of charge storage layers at respective contact areas each comprising first and second sides each parallel to the second direction and each having a first length, and comprising third and fourth sides each parallel to the first direction and each having a second length that is greater than the first length.

14. The device of claim 13 wherein each of the plurality of charge storage layers overlap all portions of the plurality of parallel active regions at the respective contact areas.

15. The device of claim 14 wherein the plurality of parallel active regions are exposed through the plurality of charge storage layers between the respective contact areas.

16. The device of claim 13 wherein the charge storage layers comprise nitride layers.

17. A nonvolatile memory device comprising:
an active region in a substrate;
a word line overlapping the active region at a respective location; and
a charge storage layer disposed at the respective location between the active region and the word line,
wherein the charge storage layer at the respective location has first and second opposing sides each having a first length, and third and fourth opposing sides each having a second length, wherein the first length is less than the second length.

18. The device of claim 17 wherein the respective location is above the active region and below the word line.

19. The device of claim 17 wherein the charge storage layer overlaps all of the active region at the respective location.

20. The device of claim 19 wherein the active region is exposed through the charge storage layer outside the respective location.

21. The device of claim 17 wherein the charge storage layer comprises a nitride layer.

22. The device of claim 17 further comprising:
an oxide layer in contact with the charge storage layer at the respective location.

23. A nonvolatile memory device comprising:
a plurality of parallel active regions defined by a plurality of device isolation layers formed on a semiconductor substrate, each of the plurality of parallel active regions extending in a first direction;
a plurality of parallel word lines each extending in a second direction and overlapping each of the plurality of parallel active regions at respective locations; and
a plurality of charge storage layers each disposed between the plurality of parallel active regions and the plurality of parallel word lines at each of the respective locations, wherein the plurality of charge storage layers substantially overlap all of upper surfaces of the active regions at the respective locations,
wherein each of the plurality of charge storage layers has a first side and a second side each being parallel to the second direction and each having a first length, and a third side and a fourth side each being parallel to the first direction and each having a second length, and
wherein the first length is smaller than the second length.

24. The device of claim 23 wherein the respective locations are above the plurality of active regions and below the plurality of word lines.

25. The device of claim 23 wherein the charge storage layers comprise nitride layers.

26. The device of claim 23 further comprising:
a plurality of oxide layers in contact with the plurality of charge storage layers at the respective locations.

* * * * *